United States Patent
Bouthinon

(10) Patent No.: US 11,776,984 B2
(45) Date of Patent: Oct. 3, 2023

(54) IMAGE SENSOR COMPRISING AN ANGULAR FILTER

(71) Applicant: ISORG, Limoges (FR)

(72) Inventor: Benjamin Bouthinon, Grenoble (FR)

(73) Assignee: ISORG, Limoges (FR)

( * ) Notice: Subject to any disclaimer, the term of this patent is extended or adjusted under 35 U.S.C. 154(b) by 91 days.

(21) Appl. No.: 17/440,001

(22) PCT Filed: Feb. 20, 2020

(86) PCT No.: PCT/FR2020/050317
§ 371 (c)(1),
(2) Date: Sep. 16, 2021

(87) PCT Pub. No.: WO2020/193889
PCT Pub. Date: Oct. 1, 2020

(65) Prior Publication Data
US 2022/0173153 A1 Jun. 2, 2022

(30) Foreign Application Priority Data
Mar. 22, 2019 (FR) ...................... 19/02965

(51) Int. Cl.
*H01L 27/146* (2006.01)
*G02B 5/00* (2006.01)
*H10K 30/30* (2023.01)

(52) U.S. Cl.
CPC ........ *H01L 27/14643* (2013.01); *G02B 5/003* (2013.01); *H10K 30/30* (2023.02)

(58) Field of Classification Search
CPC ... H01L 27/14643; H10K 30/30; G02B 5/003
See application file for complete search history.

(56) References Cited

U.S. PATENT DOCUMENTS

| | | |
|---|---|---|
| 10,165,211 B1 | 12/2018 | Borthakur et al. |
| 2004/0012734 A1 | 1/2004 | Yamanaka et al. |
| 2006/0061861 A1 | 3/2006 | Munro et al. |
| 2007/0045632 A1 | 3/2007 | Oliver et al. |
| 2008/0291445 A1 | 11/2008 | Iwane |
| 2009/0323206 A1 | 12/2009 | Oliver et al. |
| 2011/0233383 A1 | 9/2011 | Oku |

(Continued)

FOREIGN PATENT DOCUMENTS

| | | |
|---|---|---|
| EP | 3441859 A1 | 2/2019 |
| FR | 3060811 A1 | 6/2018 |

(Continued)

OTHER PUBLICATIONS

English Translation of the Written Opinion of the International Search Authority issued in counterpart PCT application No. PCT/FR2020/050317, dated May 15, 2020, 6 pp.

(Continued)

*Primary Examiner* — Thanh Luu
(74) *Attorney, Agent, or Firm* — KAPLAN BREYER SCHWARZ, LLP

(57) ABSTRACT

An image sensor includes organic photodetectors and an angular filter less than 20 μm away from the photodetectors. Further, a method of manufacturing an image sensor includes the forming of organic photodetectors and of an angular filter less than 20 μm away from the photodetectors.

20 Claims, 5 Drawing Sheets

(56) References Cited

U.S. PATENT DOCUMENTS

| | | | |
|---|---|---|---|
| 2014/0253756 A1* | 9/2014 | Yokogawa | H04N 25/135 348/229.1 |
| 2017/0084655 A1 | 3/2017 | Shibuta | |
| 2018/0288298 A1* | 10/2018 | Lim | H01L 27/14645 |
| 2019/0081098 A1 | 3/2019 | Lenchenkov et al. | |
| 2019/0148434 A1 | 5/2019 | Hsu | |
| 2022/0317351 A1 | 10/2022 | Verduci et al. | |
| 2023/0003923 A1 | 1/2023 | Schwartz et al. | |

FOREIGN PATENT DOCUMENTS

| | | |
|---|---|---|
| GB | 0165893 A | 7/1921 |
| KR | 10-2004-0090640 A | 10/2004 |
| WO | 2014/042178 A1 | 3/2014 |
| WO | 2014/143234 A1 | 9/2014 |
| WO | 2014/181643 A1 | 11/2014 |
| WO | 2017/095858 A1 | 6/2017 |
| WO | 2018/162842 A1 | 9/2018 |
| WO | 2018/223150 A1 | 12/2018 |
| WO | 2019/055771 A1 | 3/2019 |

OTHER PUBLICATIONS

Authorized Officer: Fratiloiu, Silvia, International Search Report issued in counterpart PCT application No. PCT/FR2020/050317, dated May 15, 2020, 3 pp.

Benjamin Bouthinon et al., Unpublished Related U.S. Appl. No. 17/798,859 entitled Structure of an Angular Filter On a CMOS Sensor, Aug. 10, 2022.

Non-Final Rejection dated May 10, 2023 for U.S. Appl. No. 17/798,859, 5 page(s).

Authorized Officer: Jakober, Francois, International Search Report issued in PCT application No. PCT/EP2020/084543, dated Feb. 17, 2021, 2 pp.

Authorized Officer: Mollenhauer, Ralf, International Search Report issued in PCT application No. PCT/EP2021/053011, dated Apr. 16, 2021, 2 pp.

Authorized Officer: Orignac, Xavier, International Search Report issued in PCT application No. PCT/EP2020/075049, dated Nov. 3, 2020, 2 pp.

Authorized Officer: Orignac, Xavier, International Search Report issued in PCT application No. PCT/EP2020/085380, dated Jan. 13, 2021, 2 pp.

Benjamin Bouthinon et al., Related Unpublished US Patent Application filed Jun. 9, 2022, entitled "Optical Filter Suitable for Correcting the Electronic Noise of a Sensor", U.S. Appl. No. 17/783,782.

English translation of the Written Opinion of the International Searching Authority issued in PCT application No. PCT/EP2020/075049, dated Nov. 3, 2020, 5 pp.

English translation of the Written Opinion of the International Searching Authority issued in PCT application No. PCT/EP2020/085380, dated Jan. 13, 2021, 6 pp.

English Translation of the Written Opinion of the International Searching Authority issued in PCT Application No. PCT/EP2021/053011, dated Apr. 16, 2021, 5 pp.

English Translation of Written Opinion dated Feb. 17, 2021 issued in PCT Patent Application No. PCT/EP2020/084543.

Examiner: Orignac, Xavier, Search Report issued in French patent application No. 19/14198, dated Jul. 22, 2020, 2 pp.

Unpublished application entitled Angular Filter, U.S. Appl. No. 17/782,558.

Unpublished Application entitled Optical Filter Suitable for Correcting the Electronic Noise of a Sensor, U.S. Appl. No. 17/783,782.

* cited by examiner

IMAGE SENSOR COMPRISING AN ANGULAR FILTER

CROSS REFERENCE TO RELATED APPLICATIONS

The present patent application claims the priority benefit of French patent application FR19/02965, which is herein incorporated by reference.

FIELD

The present application concerns an image sensor.

BACKGROUND

An image acquisition system comprising an image sensor generally further comprises an optical system, interposed between the sensitive portion of the image sensor and the object to be imaged and which enables to form a sharp image of the object to be imaged on the sensitive portion of the image sensor. A conventional optical system may comprise a succession of fixed or mobile lenses along the optical axis of the image acquisition system.

For certain applications, it is not possible to provide such an optical system, particularly for bulk reasons.

SUMMARY

An object of an embodiment is to increase the sharpness of the image acquired by the image sensor of an image acquisition system in the absence of an optical system forming a sharp image of the object to be imaged on the sensitive portion of the image sensor.

Another object of an embodiment is for the surface area of the sensitive portion of the image sensor to be greater than one square centimeter.

Another object of an embodiment is for the distance between the object to be imaged and the sensitive portion of the image sensor to be shorter than one centimeter.

An embodiment provides an image sensor comprising organic photodetectors and an angular filter less than 20 μm away from the photodetectors.

An embodiment also provides a method of manufacturing an image sensor comprising the forming of organic photodetectors and of an angular filter less than 20 μm away from the photodetectors.

According to an embodiment, the image sensor comprises a surface intended to receive a radiation, said photodetectors being configured to detect said radiation, the angular filter covering the image sensor and being configured to block the rays of said radiation having an incidence relative to a direction orthogonal to the surface greater than a threshold and to give way to rays of said radiation having an incidence relative to a direction orthogonal to the surface smaller than the threshold.

According to an embodiment, the angular filter comprises a layer opaque to said radiation and an array of openings formed in the layer, the openings being filled with air or with a material at least partially transparent to said radiation.

According to an embodiment, for each opening, the ratio of the height of the opening, measured perpendicularly to the surface, to the width of the opening, measured parallel to the surface, varies from 1 to 10.

According to an embodiment, the openings are arranged in rows and in columns, the pitch between adjacent openings of a same row or of a same column varying from 10 μm to 60 μm.

According to an embodiment, the height of each opening, measured along a direction orthogonal to the surface, varies from 1 μm to 1 mm.

According to an embodiment, the width of each opening, measured parallel to the surface, varies from 5 μm to 30 μm.

According to an embodiment, the image sensor comprises a substrate, a first stack of layers comprising thin-film transistors, and a second stack of layers comprising the photodetectors.

According to an embodiment, the angular filter is located in the substrate, between the substrate and the first stack, in the first stack, or between the first stack and the second stack.

According to an embodiment, the photodetectors are coupled to the transistors of the first stack by vias crossing the angular filter.

According to an embodiment, the image sensor comprises an encapsulation film tight to oxygen and to humidity covering the photodetectors and the angular filter covers the photodetectors, on the side of the photodetectors opposite to the first stack, between the photodetectors and the encapsulation film.

According to an embodiment, the image sensor or the method further comprise lenses covering the openings.

According to an embodiment, the photodetectors comprise organic photodiodes.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
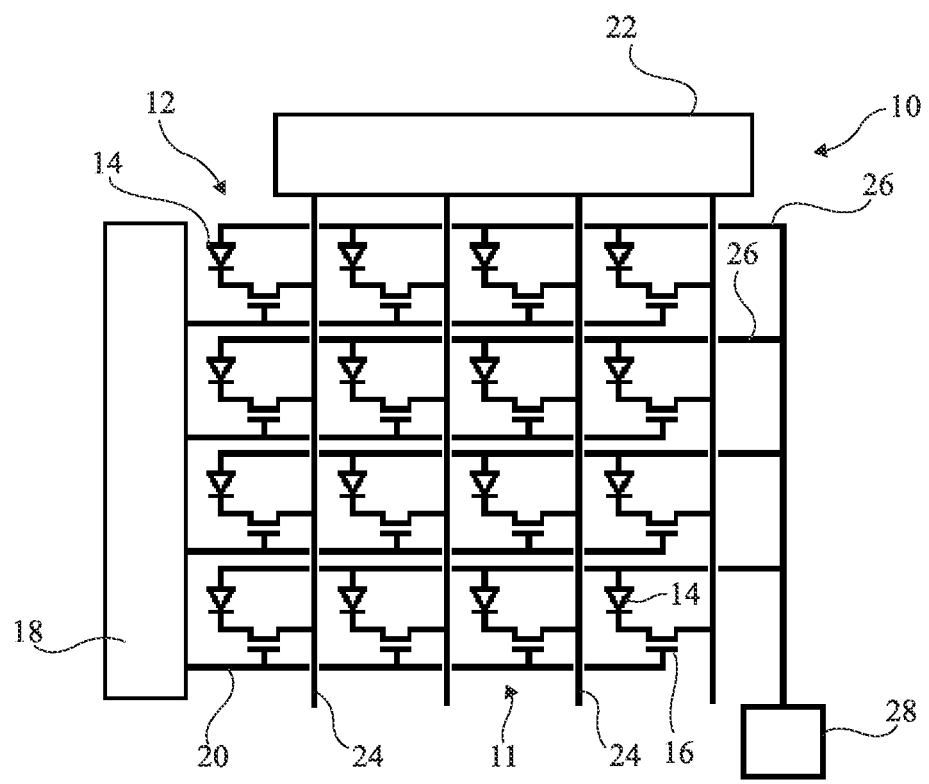
FIG. 1 shows an electric diagram of an example of an image sensor.

Like features have been designated by like references in the various figures. In particular, the structural and/or functional features that are common among the various embodiments may have the same references and may dispose identical structural, dimensional and material properties. For the sake of clarity, only the elements that are useful for an understanding of the embodiments described herein have been illustrated and described in detail. In particular, the operation of an image sensor has not been detailed, the described embodiments being compatible with usual image sensors.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to an image sensor as orientated during normal use. Unless specified otherwise, the expressions "around", "approximately", "substantially" and "in the order of" signify within 10%, and preferably within 5%. Unless specified otherwise, the expressions "around", "approximately", "substantially" and "in the order of" signify within 10%, and preferably within 5%.

The expression active region of a photodetector designates the region from which most of the electromagnetic radiation received by the photodetector is captured. In the following description, an optoelectronic component is called organic when the active region of the optoelectronic component is mainly, preferably totally, made of at least one organic material or of a mixture of organic materials.

The transmittance of a layer corresponds to the ratio of the intensity of the radiation coming out of the layer to the intensity of the radiation entering the layer, the rays of the incoming radiation being perpendicular to the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%.

The refraction index of a material corresponds to the refraction index of the material for the wavelength range of the radiation captured by the image sensor. Unless specified otherwise, the refraction index is considered as substantially constant over the wavelength range of the useful radiation, for example, equal to the average of the refraction index over the wavelength range of the radiation captured by the image sensor.

In the following description, "visible light" designates an electromagnetic radiation having a wavelength in the range from 400 nm to 700 nm and "infrared radiation" designates an electromagnetic radiation having a wavelength in the range from 700 nm to 1 mm. In infrared radiation, one can particularly distinguish near infrared radiation having a wavelength in the range from 700 nm to 1.4 µm.

FIG. 1 partially and schematically shows an image sensor 10. Image sensor 10 comprises an array 11 of detection elements 12, called detection array hereafter. Detection elements 12 may be arranged in rows and in columns. Each detection element 12 comprises a photodetector 14, for example, a photodiode, and a selection element 16, for example, a transistor having its source or drain coupled to a first electrode of photodiode 14, for example, the cathode. Image sensor 10 comprises a selection circuit 18 comprising, for each row, a conductive track 20 coupled to the gates of selection transistors 16. Image sensor 10 further comprises a readout circuit 22 comprising, for example, for each column, a conductive track 24 coupled to the source or to the drain of column selection transistors 16. Further, the second electrodes of photodiodes 14, for example, the anodes, may coupled by conductive tracks 26 to a source 28 of a reference potential.

Figure 2:
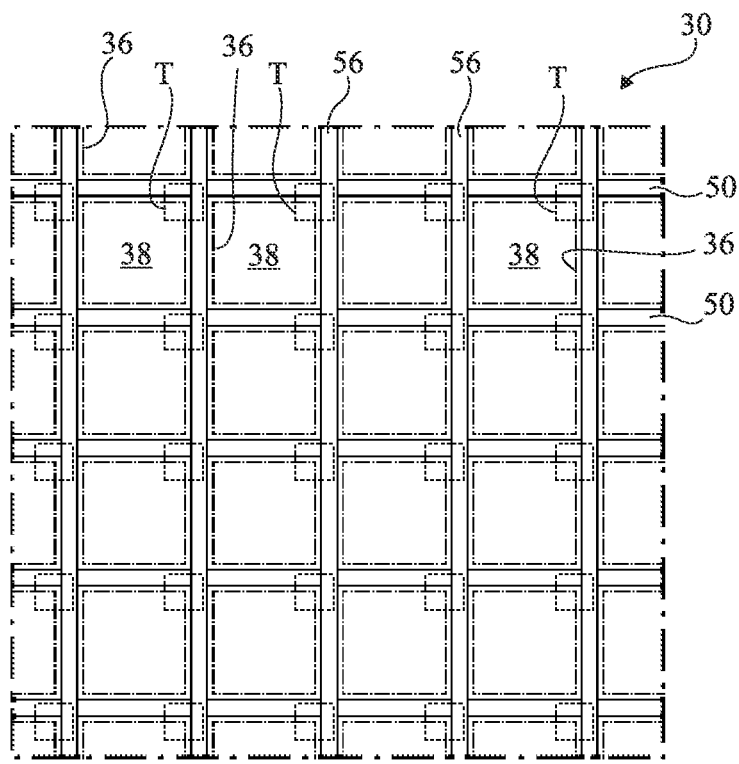
FIG. 2 is a partial simplified top view of an example of an image sensor of FIG. 1.
Figure 3:
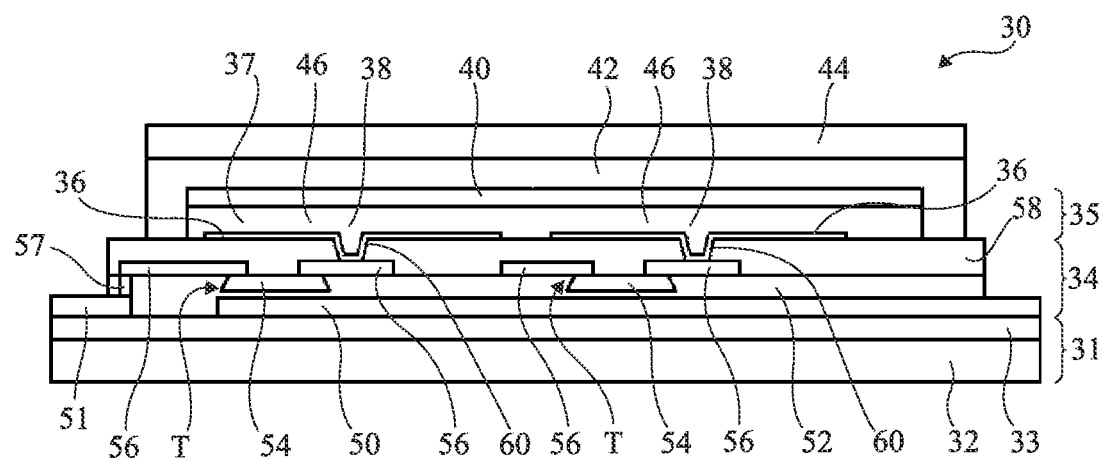
FIG. 3 is a partial simplified cross-section view of the image sensor of FIG. 2.

FIGS. 2 and 3 respectively are a top view and a lateral cross-section view, partial and simplified, of an example of a detection array 30 having an equivalent electric diagram that may correspond to the detection array 11 shown in FIG. 1.

Detection array 30 comprises, from bottom to top in FIG. 3:

- a support 31 that may have a monolayer or multilayer structure and which, in FIG. 3, comprises a substrate 32 covered with an intermediate layer 33;
- a stack 34 having thin-film transistors T formed therein, only two transistors T being shown in FIG. 3;
- a stack 35 having photodetectors 38 formed therein, for example, organic photodiodes, also called OPD, stack 35 comprising lower electrodes 36, each electrode 36 being coupled to one of transistors T, a layer 37 in contact with electrodes 36 and having the active regions of photodiodes 38 formed therein, and an upper electrode 40 in contact with layer 37, only two photodiodes 38 and two electrodes 36 being shown in FIG. 3;
- a layer of an adhesive material 42; and
- a coating 44.

Each photodiode 38 comprises an active region 46 corresponding to the portion of layer 37 interposed between the electrode 36 associated with photodiode 38 and electrode 40. As a variant, each organic photodiode 38 may comprises a first interface layer in contact with one of electrodes 36, the active region 46 in contact with the first interface layer, and a second interface layer in contact with active region 46, electrode 40 being in contact with the second interface layer.

According to the present example, stack 34 comprises:

- electrically-conductive tracks 50, 51 resting on support 31, tracks 50 forming the gate conductors of transistors T, which corresponds to the tracks 20 of the equivalent electric diagram of FIG. 1, and tracks 51 being coupled to the drains or to the sources of transistors T;
- a layer 52 of a dielectric material covering tracks 50, 51 and support 31 between tracks 50, 51 and forming the gate insulators of transistors T;
- active regions 54 resting on dielectric layer 52 opposite gate conductors 50;
- electrically-conductive tracks 56 extending on dielectric layer 52 forming the drain and source contacts of transistors T, and particularly corresponding to the tracks 24 of the equivalent electric diagram of FIG. 1, some of tracks 56 coupling active regions 54 to electrodes 36 and some of tracks 56 being electrically coupled to tracks 51 via electrically-conductive vias 57 extending through layer 52; and
- a layer 58 of a dielectric material covering active regions 54 and electrically-conductive tracks 56, electrodes 36 resting on layer 58 and being connected to some of conductive tracks 56 by conductive vias 60 crossing insulating layer 58 and electrode 40 being connected to some of conductive tracks 51 by conductive vias, not shown in FIGS. 2 and 3, crossing insulating layers 58 and 52.

In FIG. 3, transistors T are shown with a so-called inverse staggered structure. As a variant, transistors T may be of staggered type.

When at least one interface layer is present in contact with active region 46, this interface layer may correspond to an electron injection layer or to a hole injection layer. The work function of each interface layer is capable of blocking, collecting, or injecting holes and/or electrons according to whether the interface layer plays the role of a cathode or of an anode. More particularly, when the interface layer plays the role of an anode, it corresponds to a hole injection and electron blocking layer. The work function of the interface layer is then greater than or equal to 4.5 eV, preferably greater than or equal to 5 eV. When the interface layer plays the role of a cathode, it corresponds to an electron injection and hole blocking layer. The work function of the interface layer is then smaller than or equal to 4.5 eV, preferably smaller than or equal to 4.2 eV. In the present embodiment, electrode 36 or 40 advantageously directly plays the role of an electron injection layer or of a hole injection layer for photodiode 38, and it is not necessary to provide, for photodiode 38, an interface layer in contact with active region 46 and playing the role of an electron injection layer or of a hole injection layer.

Figure 4:
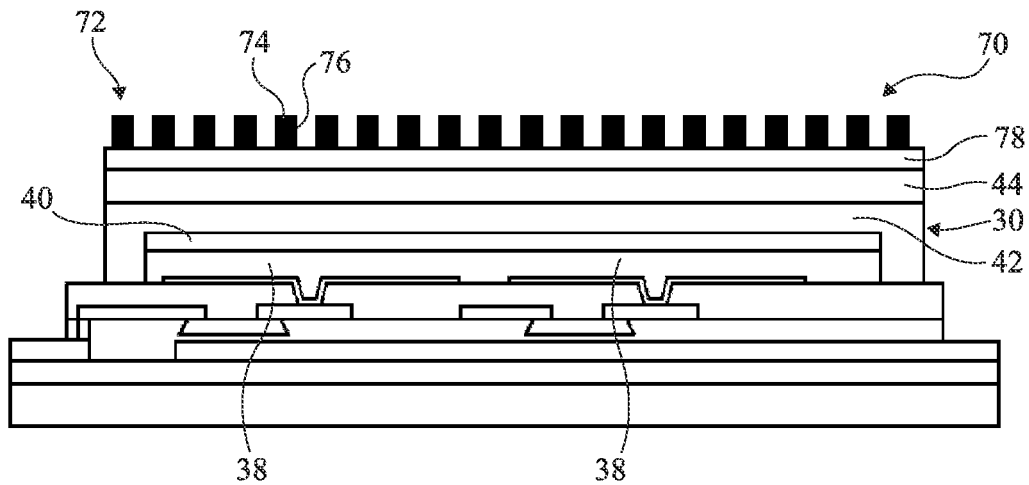
FIG. 4 is a partial simplified cross-section view of an example of an image sensor comprising an angular filter.

FIG. 4 is a lateral cross-section view of an example of an image sensor 70. Image sensor 70 comprises the detection array 30 shown in FIGS. 2 and 3 and further comprises an angular filter 72 corresponding to an opaque film 74 crossed by openings 76. Opaque film 74 is attached to coating 44 by lamination by using a layer of an adhesive material 78. Angular filter 72 is adapted to filtering the light rays according to their incidence to improve the sharpness of the images acquired by the image sensor. The angle of incidence beyond which the incident rays are blocked particularly depends on the ratio of the height to the width of openings 76.

The thickness of upper electrode 40 may be in the order of 500 nm. The thicknesses of the layers of adhesive material 42, 78 may be in the order of 25 µm. The thickness of coating 44 may be in the order of 50 µm. A disadvantage of the image sensor 70 shown in FIG. 4 then is that the distance between angular filter 72 and photodiodes 38 is generally greater than 100 µm. This may impose the use of a high height-to-width ratio for the openings 76 of angular filter 72 and complicate the manufacturing of angular filter 72. Further, the use of a high height-to-width ratio causes a decrease in the transmittance of angular filter 72, which may not be desirable. For certain applications, it is desirable to accurately place openings 76 relative to photodiodes 38. A disadvantage of image sensor 70 then is that the alignment of angular filter 72 relative to photodiodes 38 requires the implementation of additional assembly techniques, which increases the manufacturing costs of the image sensor.

Figure 5:
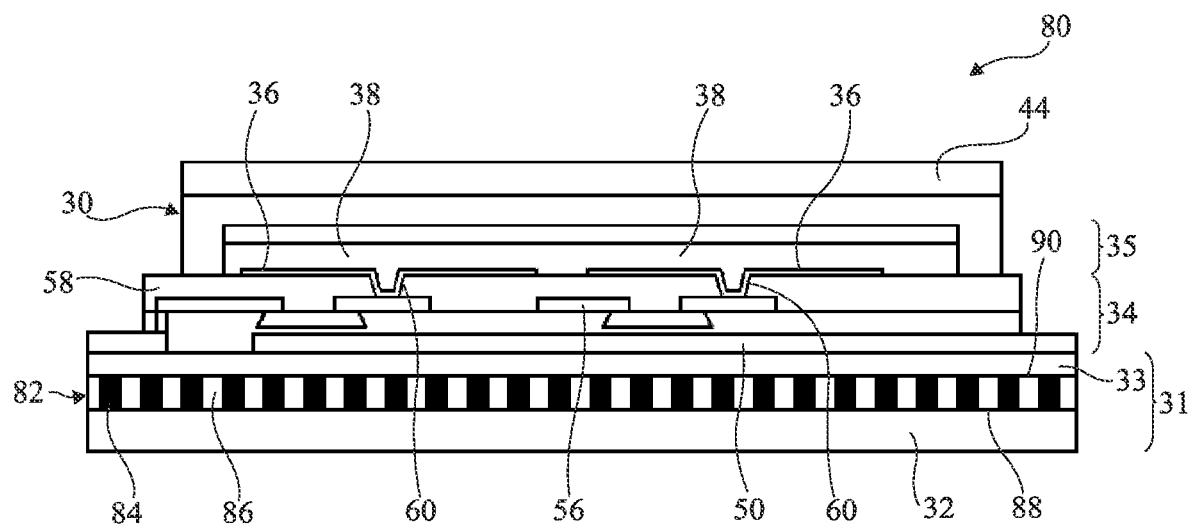
FIG. 5 is a partial simplified cross-section view of an embodiment of an image sensor comprising an angular filter.

FIG. 5 is a lateral cross-section view of an embodiment of an image sensor 80. Image sensor 80 comprises the detection array 30 shown in FIGS. 2 and 3, with the difference than an angular filter 82 is arranged between substrate 32 and stack 34. In the present embodiment, angular filter 82 is arranged between substrate 32 and intermediate layer 33. Image sensor 80 is intended to be illuminated on the side of substrate 32. As shown in FIG. 2, the conductive tracks 50 coupled to the gates of transistors T extend between the columns of photodiodes 38, and the conductive tracks 56 coupled to the sources of transistors T extend between the rows of photodiodes 38. Thereby, tracks 50, 56 may be non-transparent to the radiation captured by photodiodes 38 since they do not cover photodiodes 38.

Angular filter 82 corresponds to a layer 84, opaque to the radiation captured by photodetectors 38, and crossed by openings 86. Angular filter 82 comprises a lower surface 88 facing the side of substrate 32 and an upper surface 90 facing the side of photodiodes 38. Surfaces 88, 90 are preferably substantially planar. In the present embodiment, the distance between the upper surface 90 of angular filter 82 and photodiodes 38 is shorter than 20 µm, preferably shorter than 10 µm, more preferably shorter than 6 µm.

Angular filter 82 is capable of filtering the incident rays according to the incidence of the rays relative to the lower surface 88 of angular filter 82, particularly so that each photodetector 38 only receives rays having an incidence relative to an axis perpendicular to the lower surface 88 of angular filter 82 smaller than a maximum angle of incidence smaller than 45°, preferably smaller than 30°, more preferably smaller than 20°, more preferably still smaller than 10°. Angular filter 82 is capable of blocking the incident rays of the incident radiation having an incidence relative to an axis perpendicular to lower surface 88 of angular filter 82 smaller than the maximum angle of incidence.

Detection array 30 may further comprise a polarizing filter, arranged, for example, over coating 44 or over substrate 32 according to the illumination of the image sensor. Detection array 30 may further comprise color filters opposite photodetectors 38 to obtain a wavelength selection of the radiation reaching photodetectors 38.

Figure 6:
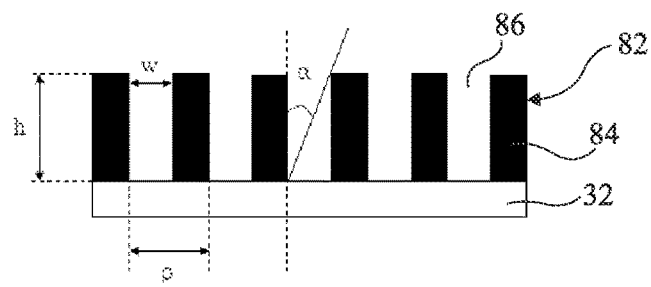
FIG. 6 is a partial simplified cross-section view of an embodiment of the angular filter shown in FIG. 5.
Figure 7:
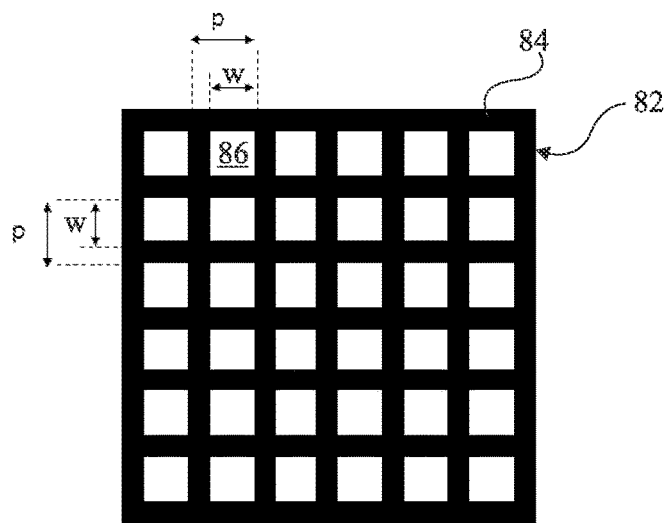
FIG. 7 is a partial simplified top view of the angular filter shown in FIG. 6.

FIGS. 6 and 7 respectively are a cross-section view and a top view, partial and simplified, of an embodiment of angular filter 82.

Call "h" the height of openings 86 measured from substrate 32. Layer 84 is opaque to the radiation detected by photodetectors 38, for example, absorbing and/or reflective with respect to the radiation detected by photodetectors 38. According to an embodiment, layer 84 is absorbing in the visible range and/or near infrared and/or infrared.

In FIG. 7, openings 86 are shown with a square cross-section. Generally, the cross-section of openings 86 in the top view may be circular, oval, or polygonal, for example, triangular, square, or rectangular.

According to an embodiment, openings 86 are arranged in rows and in columns. Openings 86 may have substantially the same dimensions. Call "w" the width of an opening 86 measured along the row or column direction. According to an embodiment, openings 86 are regularly arranged in rows and in columns. Call "p" the repetition pitch of openings 86, that is, the distance in top view between centers of two successive openings 86 of a row or of a column.

The angular filter 82 shown in FIGS. 6 and 7 only gives way to the rays of the incident radiation having an incidence relative to substrate 32 smaller than a maximum angle of incidence α, which is defined by the following relation (1):

[Math 1]

$$\tan \alpha = w/h \qquad (1)$$

The smaller ratio w/h, the smaller the maximum angle of incidence α. The transmittance for a zero incidence of angular filter 82 is proportional to the ratio of the transparent surface area in top view to the absorbing surface area of angular filter 82. For applications at a low light level, it is desirable for the transmittance to be the highest possible to increase the quantity of light collected by image sensor 80. For applications at a high light level, the transmittance may be decreased to avoid blooming image sensor 80.

According to an embodiment, photodetectors 38 may be distributed in rows and in columns. According to an embodiment, the pitch p of openings 86 is smaller than the pitch of the photodetectors 38 of image sensor 80. In this case, a plurality of openings 86 may be located opposite a photodetector 38, as schematically shown in FIG. 5. According to another embodiment, the pitch p of openings 86 is identical to the pitch of the photodetectors 38 of image sensor 80. Angular filter 82 is then preferably aligned with image sensor 80 so that each opening 86 is opposite a photodetector 38. According to an embodiment, the pitch p of openings 86 is larger than the pitch of the photodetectors 38 of image sensor 80. In this case, a plurality of photodetectors 38 may be located opposite an opening 86.

The h/w ratio may be in the range from 1 to 10. Pitch p may be in the range from 10 µm to 60 µm, for example, approximately 15 µm. Height h may be in the range from 1 µm to 1 mm, preferably from 20 µm to 100 µm. Width w may be in the range from 5 µm to 30 µm, for example, approximately 10 µm.

Figure 8:
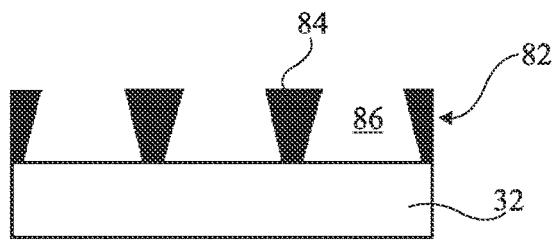
FIG. 8 is an enlarged partial simplified cross-section view of another embodiment of an angular filter.

FIG. 8 is a partial simplified cross-section view of a variant of the embodiment shown in FIG. 6, where the cross-section of openings 86 is not constant, the cross-section decreasing as the distance to substrate 32 increases. As a variant, the cross-section may increase as the distance to substrate 32 increases, successively comprise a phase of decrease followed by a phase of enlargement as the distance to substrate 32 increases, etc.

Figure 9:
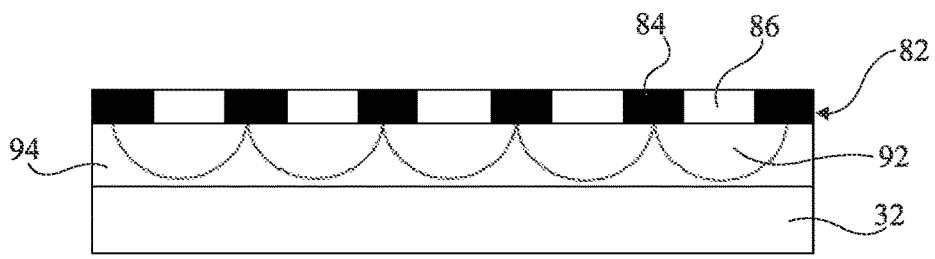
FIG. 9 is an enlarged partial simplified cross-section view of another embodiment of an angular filter.

FIG. 9 is a partial simplified cross-section view of another embodiment of angular filter 82. Angular filter 82 comprises the structure shown in FIGS. 6 and 7 and further comprises, for each opening 86, a microlens 92 resting on layer 84 and covering opening 86. A bonding layer 94 is arranged between microlenses 92 and substrate 32.

Each microlens 92 advantageously enables to increase the collection of rays of the incident radiation having an incidence smaller than a desired maximum angle of incidence but which would be blocked by the walls of openings 86 in the absence of microlens 92. Such an embodiment is particularly adapted to applications where the light level is low. The filling material of openings 86 may be the same as the material forming microlenses 92. The microlenses may be converging lenses each having a focal distance f in the range from 1 µm to 100 µm, preferably from 1 µm to 50 µm.

The pitch of microlenses 92 may be the same as the pitch of photodetectors 38 or smaller. In the presence of microlenses 92, the openings 86 of angular filter 82 essentially act as an optical micro-diaphragm between microlenses 92 and photodetectors 38 so that there is less constraint on the aspect ratio w/h of openings 86 as compared with the case where microlenses 92 are not present. The maximum angle of incidence is determined by the width w of openings 86 and the curvature of microlenses 92.

As a variant, each microlens may be replaced with another type of micrometer-range optical element, particularly a micrometer-range Fresnel lens, a micrometer-range index gradient lens, or a micrometer-range diffraction grating.

Figure 10:
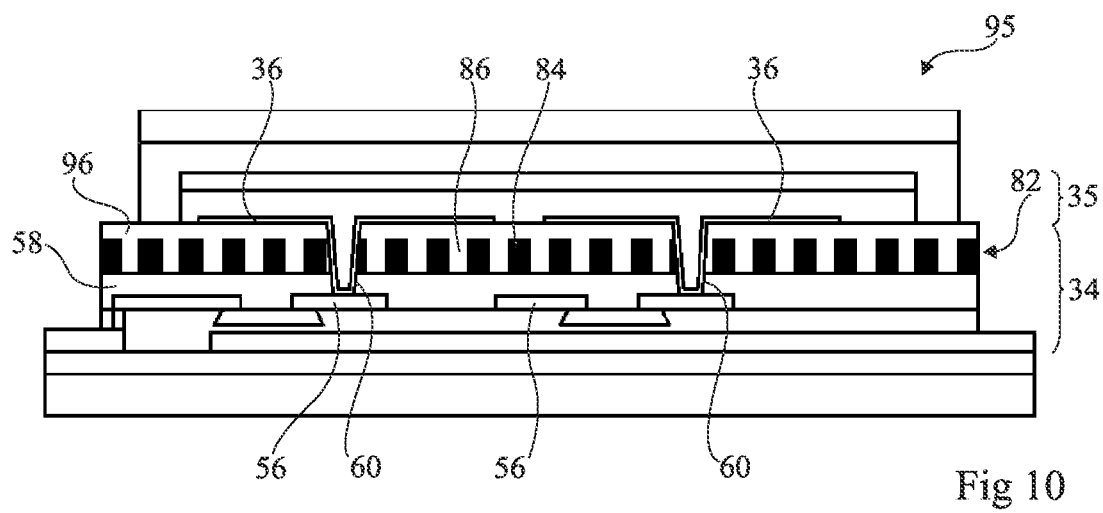
FIG. 10 is a partial simplified cross-section view of another embodiment of an image sensor comprising an angular filter.

FIG. 10 is a lateral cross-section view of an embodiment of an image sensor 95. Image sensor 95 comprises all the elements of the image sensor 80 shown in FIG. 5, with the difference that angular filter 82 is located in stack 34. In the present embodiment, angular filter 82 is located in an insulating layer 96 covering layer 58. The height h of openings 86 may be equal to or smaller than the thickness of insulating layer 96. Insulating layer 96 may fill openings 86. Vias 60, which couple electrodes 36 to conductive tracks 56, thus further cross angular filter 82 and insulating layer 96. Image sensor 95 is intended to be illuminated on the side of substrate 32.

Figure 11:
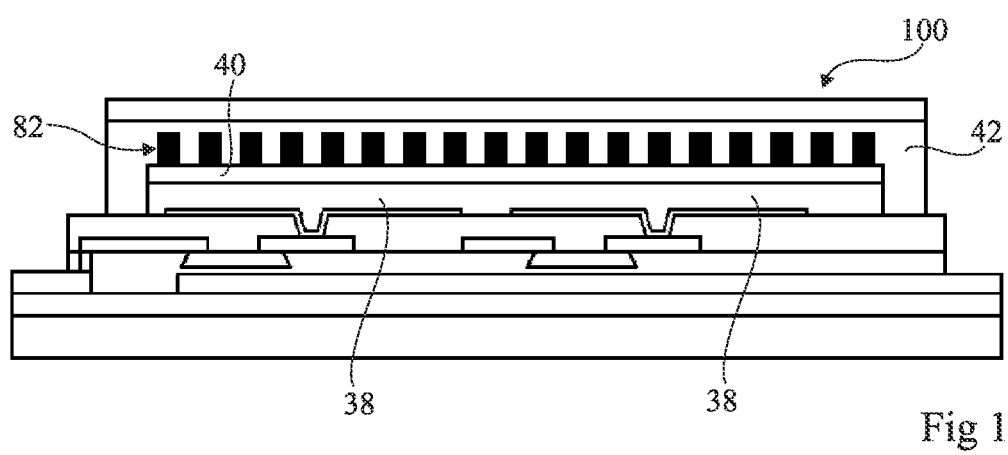
FIG. 11 is a partial simplified cross-section view of another embodiment of an image sensor comprising an angular filter.
Figure 12:
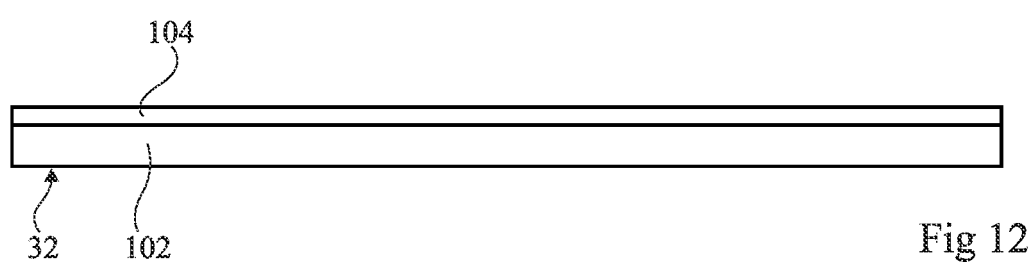
FIG. 12 is a partial simplified cross-section view illustrating a step of an embodiment of a method of manufacturing the image sensor shown in FIG. 5.
Figure 13:
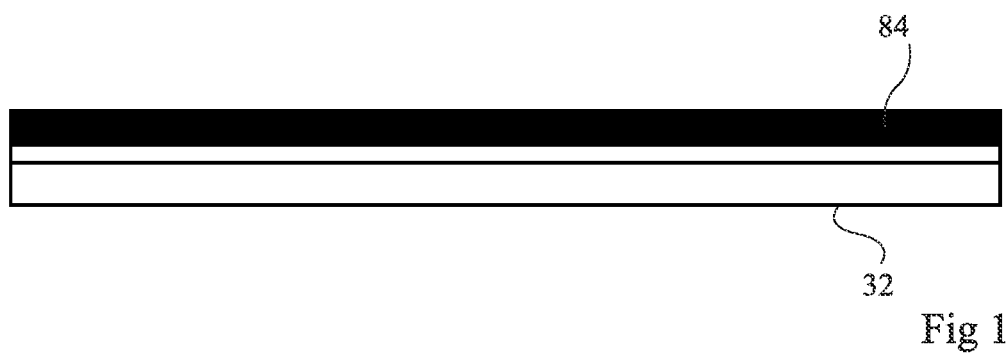
FIG. 13 illustrates another step of the method.
Figure 14:
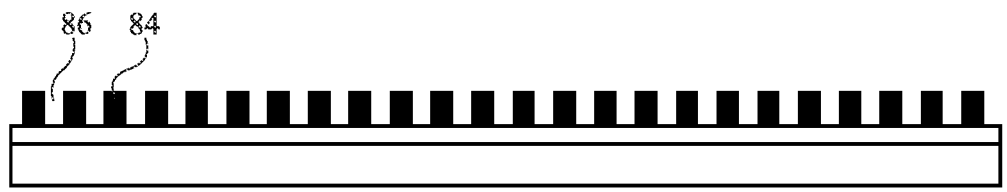
FIG. 14 illustrates another step of the method.
Figure 15:
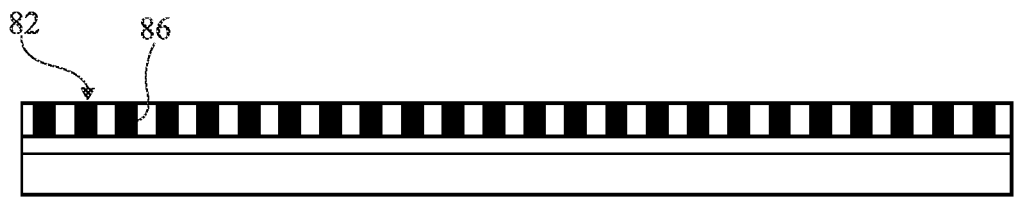
FIG. 15 illustrates another step of the method.
Figure 16:
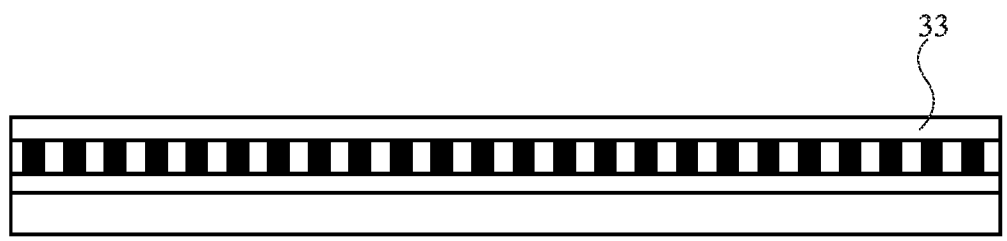
FIG. 16 illustrates another step of the method.

FIG. 11 is a lateral view of an embodiment of an image sensor 100. Image sensor 100 comprises all the elements of the image sensor 80 shown in FIG. 5, with the difference that angular filter 82 is located on electrode 40, on the side of electrode 40 opposite to photodetectors 38. Openings 86 may be filled with the adhesive material of adhesive layer 42. Image sensor 100 is intended to be illuminated on the side of coating 44.

Substrate 32 is made of a material at least partially transparent to the radiation captured by photodetectors 38. Substrate 32 may be a rigid substrate or a flexible substrate. Substrate 32 may have a monolayer structure or correspond to a stack of at least two layers. An example of a rigid substrate comprises a silicon, germanium, or glass substrate. Preferably, substrate 32 is a flexible film. An example of flexible substrate comprises a film of PEN (polyethylene naphthalate), PET (polyethylene terephthalate), PI (polyimide), TAC (cellulose triacetate), COP (cycloolefin copolymer), or PEEK (polyetheretherketone). Substrate 32 may comprise an inorganic layer, for example, made of glass, covered with an organic layer, for example, made of PEN, PET, PI, TAC, COP. The thickness of substrate 32 may be in the range from 5 µm to 1,000 µm. According to an embodiment, substrate 32 may have a thickness in the range from 10 µm to 500 µm, preferably from 20 µm to 300 µm, particularly in the order of 75 µm, and may have a flexible behavior, that is, substrate 32 may, under the action of an external force, deform, and particularly bend, without breaking or tearing.

Intermediate layer 33 may be a layer substantially tight to oxygen and to humidity to protect the organic layers of detection area 30. It may be a layer or layers deposited by atomic layer deposition (ALD), for example, an $Al_2O_3$ layer, layers deposited by physical vapor deposition (PVD) or by plasma-enhanced chemical vapor deposition (PECVD), for example, made of SiN or of $SiO_2$. Intermediate layer 33 may have a monolayer structure or correspond to a stack of at least two layers, comprising, for example, organic layers and inorganic layers.

Conductive tracks 50, 51, 56, electrode 40 (when the image sensor is intended to be illuminated on the side of substrate 32), and electrode 36 and via 60 (when the image sensor is intended to be illuminated on the side of coating 44) may be made of a metallic material, for example, silver (Ag), aluminum (Al), gold (Au), copper (Cu), nickel (Ni), titanium (Ti), chromium (Cr), and molybdenum (Mo). Conductive tracks 50, 51, 56, electrode 40 (when the image sensor is intended to be illuminated on the side of substrate 32), and electrode 36 and via 60 (when the image sensor is intended to be illuminated on the side of coating 44) may have a monolayer or multilayer structure.

Each insulating layer 52, 58, 96 of stack 34 may be made of an inorganic material, for example, of silicon oxide ($SiO_2$) or of silicon nitride (SiN), or an insulating organic layer, for example, made of organic resin.

According to an embodiment, the material forming electrodes 36, 40 is selected from the group comprising:
transparent conductive oxides (TCO), particularly indium tin oxide (ITO), aluminum zinc oxides (AZO), gallium zinc oxides (GZO), tungsten oxide ($WO_3$), nickel oxide (NiO), vanadium oxide ($V_2O_5$), molybdenum oxide (MoO$_3$), ITO/Ag/ITO alloys, ITO/Mo/ITO alloys, AZO/Ag/AZO alloys, or ZnO/Ag/ZnO alloys;

metals or a metal alloys, for example, silver (Ag), gold (Au), lead (Pb), palladium (Pd), copper (Cu), nickel (Ni), tungsten (W), molybdenum (Mo), aluminum (Al), or chromium (Cr), or an alloy of magnesium and silver (MgAg);

carbon, silver, and/or copper nanowires;

graphene;

conductive polymers, particularly the PEDOT:PSS polymer, which is a mixture of poly(3,4)-ethylenedioxythiophene and of sodium polystyrene sulfonate, or a polyaniline; and mixtures of at least two of these materials.

When detection array 30 is exposed to a light radiation which reaches photodiodes 38 through coating 44, electrode 40 and coating 44 are at least partly transparent to the electromagnetic radiation captured by photodiodes 38. Electrode 40 is for example made of TCO or of a doped polymer, for example, of PEDOT:PSS. Electrodes 36 and substrate 32 may then be opaque to the electromagnetic radiation captured by photodiodes 38. When the radiation reaches photodiodes 38 through substrate 32, electrodes 36 and substrate 32 are made of a material at least partly transparent to the electromagnetic radiation captured by photodiodes 38. Electrodes 36 are for example made of TCO. Electrode 40 may then be opaque to the electromagnetic radiation captured by photodiodes 38.

When the image sensor is illuminated on the side of coating 44, adhesive material layer 42 is transparent or partially transparent to visible light. Layer 42 of adhesive material is preferably substantially air- and water-tight. The material forming layer 42 of adhesive material is selected from the group comprising a polyepoxide or a polyacrylate. Among polyepoxides, the material forming layer 42 of adhesive material may be selected from the group comprising bisphenol A epoxy resins, particularly the bisphenol A diglycidyl ether (DGEBA) and the bisphenol A and tetrabromobisphenol A diglycidyl ethers, bisphenol F epoxy resins, novolac epoxy resins, particularly epoxy-phenol-novolacs (EPN) and epoxy-cresol-novolacs (EON), aliphatic epoxy resins, particularly epoxy resins with glycidil groups and cycloaliphatic epoxides, glycidyl amine epoxy resins, particularly the methylene dianiline glycidyl ethers (TGMDA), and a mixture of at least two of these compounds. Among polyacrylates, the material forming layer 42 of adhesive material may be made of monomers comprising acrylic acids, methyl methacrylate, acrylonitrile, methacrylates, methyl acrylate, ethyl acrylate, 2-chloroethyl vinyl ether, 2-ethylhexyl acrylate, hydroxyethyl methacrylate, butyl acrylate, butyl methacrylate, trimethylol propane triacrylate (TMPTA), or derivatives of these products. When layer 42 of adhesive material comprises at least one polyepoxide or one polyacrylate, the thickness of the layer of adhesive material 42 is in the range from 1 μm to 50 μm, preferably from 5 μm to 40 μm, particularly in the order of 15 μm.

Coating 44 is a flexible film. An example of flexible film comprises a film of PEN (polyethylene naphthalate), PET (polyethylene terephthalate), PI (polyimide), TAC (cellulose triacetate), COP (cycloolefin copolymer), or PEEK (polyetheretherketone). The thickness of coating 44 may be in the range from 5 μm to 1,000 μm. Coating 44 may comprise at least one layer substantially tight to oxygen and to humidity protect the organic layers of detection array 30. Coating 44 may comprise at least one SiN layer, for example, deposited by PECVD and/or one aluminum oxide layer (Al$_2$O$_3$), for example, deposited by ALD.

The layer 37 having photodiodes 38 formed therein may comprise small molecules, oligomers, or polymers. These may be organic or inorganic materials. Layer 37 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of layer 37 may be in the range from 50 nm to 2 μm, for example, in the order of 500 nm.

Example of P-type semiconductor polymers capable of forming layer 37 are poly(3-hexylthiophene) (P3HT), poly [N-9'-heptadecanyl-2,7-carbazole-alt-5,5-(4,7-di-2-thienyl-2',1',3'-benzothiadiazole)] (PCDTBT), poly[(4,8-bis-(2-ethylhexyloxy)-benzo[1,2-b;4,5-b']dithiophene)-2,6-diyl-alt-(4-(2-ethylhexanoyl)-thieno[3,4-b]thiophene))-2,6-diyl] (PBDTTT-C), poly[2-methoxy-5-(2-ethyl-hexyloxy)-1,4-phenylene-vinylene] (MEH-PPV), or poly[2,6-(4,4-bis-(2-ethylhexyl)-4H-cyclopenta[2,1-b;3,4-b']dithiophene)-alt-4,7(2,1,3-benzothiadiazole)] (PCPDTBT).

Examples of N-type semiconductor materials capable of forming layer 37 are fullerenes, particularly C60, [6,6]-phenyl-C$_{61}$-methyl butanoate ([60]PCBM), [6,6]-phenyl-C$_{71}$-methyl butanoate ([70]PCBM), perylene diimide, zinc oxide (ZnO), or nanocrystals enabling to form quantum dots.

When they are present, the thickness of each interface layer may be in the range from 0.1 nm to 1 μm. One of the interface layers may be made of cesium carbonate (CsCO$_3$), of metal oxide, particularly of zinc oxide (ZnO), or of a mixture of at least two of these compounds. One or the interface layers may comprise a self-assembled monomolecular layer or a polymer, for example, (polyethyleneimine, ethoxylated polyethyleneimine, poly[(9,9-bis(3'-(N,N-dimethylamino)propyl)-2,7-fluorene)-alt-2,7-(9,9-dioctylfluorene)]. The other interface layer may be made of copper oxide (CuO), of nickel oxide (NiO), of vanadium oxide (V$_2$O$_5$), of magnesium oxide (MgO), of tungsten oxide (WO$_3$), or of a mixture of at least two of these compounds.

Active regions 54 may be made of polysilicon, particularly low-temperature polycrystalline silicon (LTPS), of amorphous silicon (aSi), of zinc-gallium-indium (IGZO), of polymer, or comprise small molecules used in known fashion for the forming of organic thin film transistors (OTFT).

According to an embodiment, layer 84 may be totally made of a material absorbing at least for the wavelengths to be angularly filtered. Layer 84 may be made of colored resin, for example, a colored or black SU-8 resin. As an example, layer 84 may be made of a black resin absorbing in the visible range and in near infrared. Openings 86 may be filled with air or filled with a material at least partially transparent to the radiation detected by photodetectors 38, for example polydimethylsiloxane (PDMS). As a variant, openings 86 may be filled with a partially absorbing material in order to chromatically filter the rays angularly filtered by angular filter 82. Angular filter 82 may then further play the role of a colored filter. This enables to decrease the thickness of the system as compared with the case where a colored filter different from angular filter 82 would be present. The partially absorbing filling material may be a colored resin or a colored plastic material such as PDMS. The filling material of openings 86 may be adapted to have a refraction index matching with the layers in contact with angular filter 82 or to rigidify the structure and improve the mechanical resistance of angular filter 82.

When microlenses 92 are present, microlenses 92 may be made of silica, of polymethyl methacrylate (PMMA), of positive resist, of PET, of PEN, of COP, of a mixture of polydimethylsiloxane (PDMS) and silicone, or of epoxy resin. Microlenses 14 may be formed by flowing of resist blocks. Microlenses 14 may further be formed by molding on a layer of PET, PEN, COP, PDMS/silicone or epoxy resin.

Bonding layer 94 may be obtained from an optically clear adhesive (OCA), particularly a liquid optically clear adhesive (LOCA), or a material having a low refraction index, or an epoxy/acrylate glue, or a film of a gas or of a gaseous mixture, for example, air. Preferably, when bonding layer 94 follows the shape of microlenses 92, layer 94 is made of a material having a low refraction index, lower than that of the material of microlenses 92. Layer 94 may be made of a filling material which is a non-adhesive transparent material. According to another embodiment, layer 94 corresponds to a film having the array of microlenses 92 applied thereto, for example, an OCA film. In this case, the contact area between layer 94 and microlenses 92 may be decreased, for example, limited to the tops of the microlenses. Layer 94 may then be made of a material having a higher refraction index than in the case where layer 94 follows the shape of microlenses 96.

According to the considered materials, the method of forming at least certain layers of the image sensor may correspond to a so-called additive process, for example, by direct printing of the material forming the organic layers at the desired locations, particularly in sol-gel form, for example, by inkjet printing, photogravure, silk-screening, flexography, spray coating, or drop casting. According to the considered materials, the method of forming the layers of the image sensor may correspond to a so-called subtractive method, where the material forming the organic layer is deposited all over the structure and where the non-used portions are then removed, for example, by photolithography or laser ablation. Methods such as spin coating, spray coating, heliography, slot-die coating, blade coating, flexography, or silk-screening, may in particular be used. When the layers are metallic, the metal is for example deposited by evaporation or by cathode sputtering over the entire support and the metal layers are delimited by etching.

Advantageously, at least some of the layers of the image sensor may be formed by printing techniques. The materials of the previously-described layers may be deposited in liquid form, for example, in the form of conductive and semiconductor inks by means of inkjet printers. "Materials in liquid form" here also designates gel materials capable of being deposited by printing techniques. Anneal steps may be provided between the depositions of the different layers, but it is possible for the anneal temperatures not to exceed 150° C., and the deposition and the possible anneals may be carried out at the atmospheric pressure.

Figure 17:
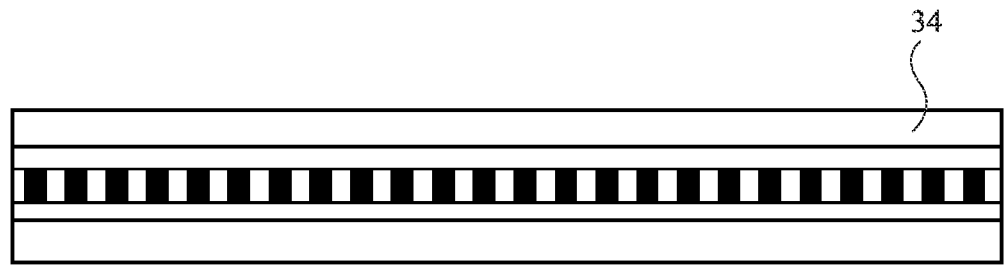
FIG. 17 illustrates another step of the method.
Figure 18:
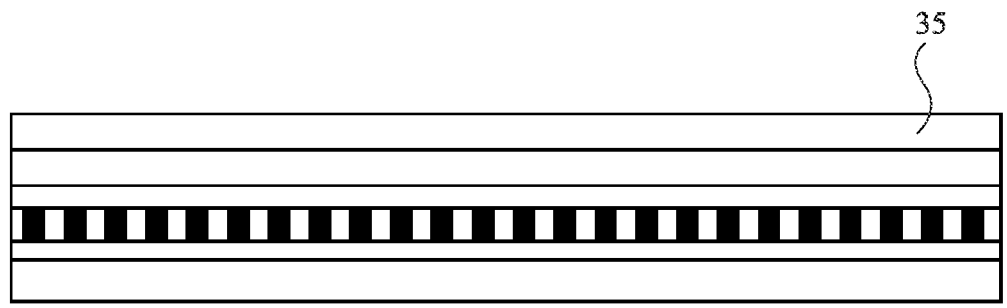
FIG. 18 illustrates another step of the method.

FIGS. 12 to 16 are cross-section views of structures obtained at successive steps of an embodiment of a method of manufacturing the image sensor 80 shown in FIG. 5, comprising the following successive steps:

a) forming of substrate 32, for example comprising a stack of two layers 102, 104 (FIG. 12);
b) deposition of a layer of colored resin 84 on substrate 32, having a thickness substantially equal to height h (FIG. 13);
c) printing of the patterns of openings 86 in resin layer 84 by photolithography and development of the resin layer to form openings 86 (FIG. 14);
d) filling of openings 86 (FIG. 15);
e) forming of intermediate layer 33 (FIG. 16);
f) forming of stack 34 with transistors (FIG. 17); and
g) forming of the stack 35 of the layers associated with the photodiodes (FIG. 18).

The final steps of the method particularly comprise the application of coating 44 and of layer 42 of adhesive material.

An embodiment of a method of manufacturing the image sensor 95 shown in FIG. 10 comprises the steps previously described in relation with FIGS. 12 to 18, with the difference that steps b), c), and d) are carried out after step f). An advantage of the methods of manufacturing image sensors 80 and 95 is that the opaque layer 84 of angular filter 82 is not deposited in contact with layer 37, the solvent used for the deposition of opaque layer 84 being capable of degrading layer 37.

An embodiment of a method of manufacturing the image sensor 100 shown in FIG. 11 comprises the steps previously-described in relation with FIGS. 12 to 18, with the difference that steps b), c) and d) are carried out after step g) and before the application of coating 44 and of layer 42 of adhesive material. An advantage of the methods of manufacturing image sensors 80, 95, and 100 is that the opaque layer 84 of angular filter 82 is not deposited in contact with coating 44, since the steps of forming of openings 86 may degrade coating 44.

Various embodiments and variants have been described. Those skilled in the art will understand that certain features of these various embodiments and variants may be combined, and other variants will occur to those skilled in the art. In particular, the embodiments of filter 82 shown in FIGS. 6, 7 8, and 9 may be implemented with any of the image sensors shown in FIGS. 5, 10, and 11. Finally, the practical implementation of the embodiments and variants described herein is within the capabilities of those skilled in the art based on the functional indications provided hereinabove.

The invention claimed is:

1. An image sensor comprising:
   organic photodetectors;
   an angular filter less than 20 μm away from the photodetectors; and
   a surface intended to receive a radiation, said photodetectors being configured to detect said radiation, the angular filter covering the organic photodetectors and being configured to block the rays of said radiation having an incidence relative to a direction orthogonal to the surface greater than a threshold and to give way to rays of said radiation having an incidence relative to a direction orthogonal to the surface smaller than the threshold,
   wherein the angular filter comprises a layer opaque to said radiation and an array of openings formed in the layer, the openings being filled with air or with a material at least partially transparent to said radiation, and
   wherein the openings are arranged in rows and in columns, a pitch between adjacent openings of a same row or of a same column varying from 10 μm to 60 μm.

2. The image sensor according to claim 1, wherein, for each opening, a ratio of a height of the opening, measured perpendicularly to the surface, to a width of the opening, measured parallel to the surface, varies from 1 to 10.

3. The image sensor according to claim 1, further comprising lenses covering the openings.

4. The image sensor according to claim 1, further comprising a substrate, a first stack of layers comprising thin-film transistors, and a second stack of layers comprising the photodetectors.

5. The image sensor according to claim 4, wherein the angular filter is located in the substrate, between the substrate and the first stack, in the first stack, or between the first stack and the second stack.

6. The image sensor according to claim 4, wherein the photodetectors are coupled to the transistors of the first stack by vias crossing the angular filter.

7. The image sensor according to claim 4, further comprising an encapsulation film tight to oxygen and to humidity covering the photodetectors and wherein the angular filter covers the photodetectors, on the side of the photodetectors opposite to the first stack, between the photodetectors and the encapsulation film.

8. The image sensor according to claim 1, wherein the photodetectors comprise organic photodiodes.

9. An image sensor comprising:
   organic photodetectors;
   an angular filter less than 20 µm away from the photodetectors; and
   a surface intended to receive a radiation, said photodetectors being configured to detect said radiation, the angular filter covering the organic photodetectors and being configured to block the rays of said radiation having an incidence relative to a direction orthogonal to the surface greater than a threshold and to give way to rays of said radiation having an incidence relative to a direction orthogonal to the surface smaller than the threshold,
   wherein the angular filter comprises a layer opaque to said radiation and an array of openings formed in the layer, the openings being filled with air or with a material at least partially transparent to said radiation, and
   wherein a height of each opening, measured along a direction orthogonal to the surface, varies from 1 µm to 1 mm.

10. An image sensor comprising:
    organic photodetectors;
    an angular filter less than 20 µm away from the photodetectors; and
    a surface intended to receive a radiation, said photodetectors being configured to detect said radiation, the angular filter covering the organic photodetectors and being configured to block the rays of said radiation having an incidence relative to a direction orthogonal to the surface greater than a threshold and to give way to rays of said radiation having an incidence relative to a direction orthogonal to the surface smaller than the threshold,
    wherein the angular filter comprises a layer opaque to said radiation and an array of openings formed in the layer, the openings being filled with air or with a material at least partially transparent to said radiation, and
    wherein a width of each opening, measured parallel to the surface, varies from 5 µm to 30 µm.

11. A method of manufacturing an image sensor comprising:
    forming organic photodetectors;
    forming an angular filter less than 20 µm away from the photodetectors; and
    forming a surface intended to receive a radiation,
    wherein said forming of said organic photodetectors includes configuring said organic photodetectors to detect said radiation, and
    wherein said forming of said angular filter comprises:
      covering said organic photodetectors with said angular filter;
      configuring said angular filter to block said rays of said radiation having an incidence relative to a direction orthogonal to said surface greater than a threshold and to give way to rays of said radiation having an incidence relative to a direction orthogonal to said surface smaller than the threshold;
      forming a layer opaque to said radiation;
      forming an array of openings in said layer;
      filling the openings with air or with a material at least partially transparent to said radiation;
      arranging the openings in rows and in columns; and
      varying a pitch between adjacent openings of a same row or of a same column from 10 µm to 60 µm.

12. The method according to claim 11, wherein, for each opening, varying a ratio of a height of the opening, measured perpendicularly to the surface, to a width of the opening, measured parallel to the surface, from 1 to 10.

13. The method according to claim 11, further comprising forming lenses covering the openings.

14. The method according to claim 11, further comprising forming a substrate, a first stack of layers comprising thin-film transistors, and a second stack of layers comprising the photodetectors.

15. The method according to claim 14, wherein the angular filter is formed in the substrate, between the substrate and the first stack, in the first stack, or between the first stack and the second stack.

16. The method according to claim 14, wherein the photodetectors are coupled to the transistors of the first stack by vias crossing the angular filter.

17. The method according to claim 14, further comprising forming an encapsulation film tight to oxygen and to humidity covering the photodetectors and wherein the angular filter covers the photodetectors, on the side of the photodetectors opposite to the first stack, between the photodetectors and the encapsulation film.

18. The method according to claim 11, wherein the photodetectors comprise organic photodiodes.

19. A method of manufacturing an image sensor comprising:
    forming organic photodetectors;
    forming an angular filter less than 20 µm away from the photodetectors; and
    forming a surface intended to receive a radiation,
    wherein said forming of said organic photodetectors includes configuring said organic photodetectors to detect said radiation, and
    wherein said forming of said angular filter comprises:
      covering said organic photodetectors with said angular filter;
      configuring said angular filter to block said rays of said radiation having an incidence relative to a direction orthogonal to said surface greater than a threshold and to give way to rays of said radiation having an incidence relative to a direction orthogonal to said surface smaller than the threshold;
      forming a layer opaque to said radiation;
      forming an array of openings in said layer;
      filling the openings with air or with a material at least partially transparent to said radiation; and
      varying a height of each opening, measured along a direction orthogonal to the surface, from 1 µm to 1 mm.

20. A method of manufacturing an image sensor comprising:
    forming organic photodetectors;

forming an angular filter less than 20 μm away from the photodetectors; and forming a surface intended to receive a radiation, wherein said forming of said organic photodetectors includes configuring said organic photodetectors to detect said radiation, and wherein said forming of said angular filter comprises:
  covering said organic photodetectors with said angular filter;
  configuring said angular filter to block said rays of said radiation having an incidence relative to a direction orthogonal to said surface greater than a threshold and to give way to rays of said radiation having an incidence relative to a direction orthogonal to said surface smaller than the threshold;
  forming a layer opaque to said radiation;
  forming an array of openings in said layer;
  filling the openings with air or with a material at least partially transparent to said radiation; and varying a width of each opening, measured parallel to the surface, from 5 μm to 30 μm.

* * * * *